United States Patent [19]
Watanabe

[11] Patent Number: 5,691,557
[45] Date of Patent: Nov. 25, 1997

[54] SEMICONDUCTOR CIRCUIT HAVING INPUT PROTECTIVE CIRCUIT

[75] Inventor: Toshio Watanabe, Tokyo, Japan

[73] Assignee: NEC Corporation, Tokyo, Japan

[21] Appl. No.: 356,965

[22] Filed: Dec. 16, 1994

[30] Foreign Application Priority Data

Dec. 17, 1993 [JP] Japan .................................. 5-317838

[51] Int. Cl.$^6$ .................................................. H01L 29/72
[52] U.S. Cl. ........................ 257/357; 257/358; 257/360; 257/361; 257/368; 257/369; 257/560
[58] Field of Search ............................... 257/369, 368, 257/360, 361, 560, 357, 358

[56] References Cited

U.S. PATENT DOCUMENTS 4,807,277  2/1989  Perry ........................................ 257/360

FOREIGN PATENT DOCUMENTS

60-257576  12/1985  Japan .

*Primary Examiner*—Edward Wojciechowicz
*Attorney, Agent, or Firm*—Whitham, Curtis, Whitham, & McGinn

[57] ABSTRACT

Disclosed herein is an input protection circuit for a semiconductor device, which includes a first node, a second node, a power supply line, an input terminal connected to directly said first node, a first resistor connected between said first node and second node for decreasing surge voltage to said internal circuit from said input terminal, a first discharge circuit connected between said second node and said power supply line, and a second discharge circuit connected between said first node and said power supply line. The second node is in turn connected to an internal circuit having a MOS transistor to be protected.

23 Claims, 8 Drawing Sheets

SEMICONDUCTOR CIRCUIT HAVING INPUT PROTECTIVE CIRCUIT

BACKGROUND OF THE INVENTION

The present invention relates to a semiconductor circuit and more particularly, to a semiconductor circuit having an input protective circuit.

In a conventional CMOS circuit shown in FIG. 11, a P-type MOS field effect transistor (referred to as P-type MOSFET hereinafter) 84 and an N-type MOS field effect transistor (referred to as N-type MOSFET hereinafter) 85 are connected in series between a high potential power supply line VDD and a low potential power supply line GND, and the respective gates of the P-type MOSFET 84 and the N-type MOSFET 85 are connected via a wiring 83 in common to one end of a protective resistor 82 whose other end is in turn connected an input terminal 81. A diode 86 is connected between a power supply terminal VDD and the line 83, an anode and an cathode thereof being connected to the common gate line 83 and the VDD, respectively, and a diode 87 is connected between the GND and the common gate line 83, an anode and an cathode thereof being connected to the GND and the common gate line 83, respectively. When a surge voltage is applied to the input terminal 81, each gate of P-type MOSFET 84 and N-type MOSFET 85 is protected by clamping the surge voltage by making current pass to discharge the surge voltage to the VDD or the GND.

Figure 12:
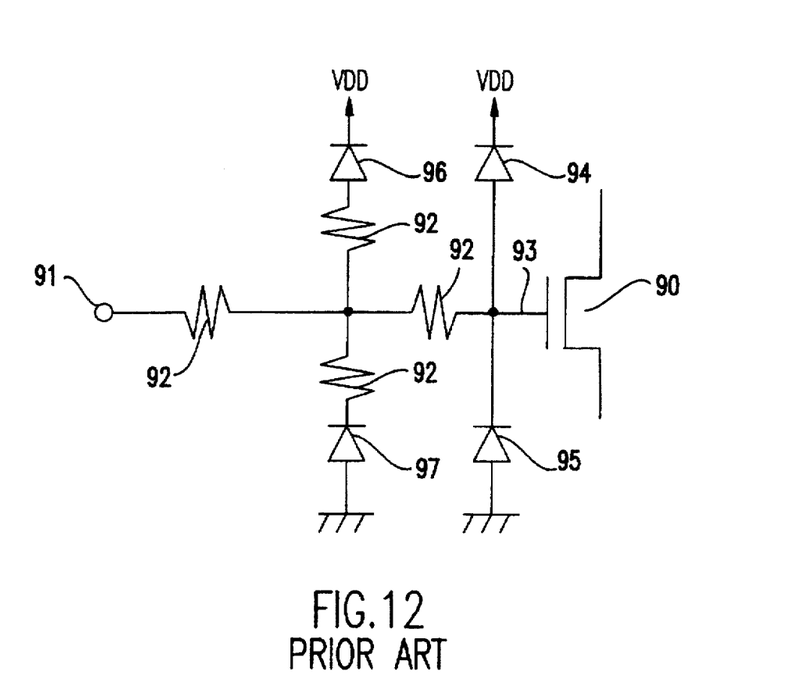
FIG. 12 is a circuit diagram of another prior art.

In FIG. 12, another input protective circuit is disclosed in Provisional Japanese Patent Publication No. Sho 60-257576. In this protective circuit, the gate of a MOSFET 90 is connected to an input terminal 91 via a gate line 93 and two resistors 92. The gate of MOSFET 90 is connected to VDD and GND via a diode 94 and a diode 95, respectively. The connection node of the register 92 and the resistor 92 is connected to VDD and GND via a register 92 and a diode 96 and a resistor 92 and a diode 97, respectively.

Figure 11:
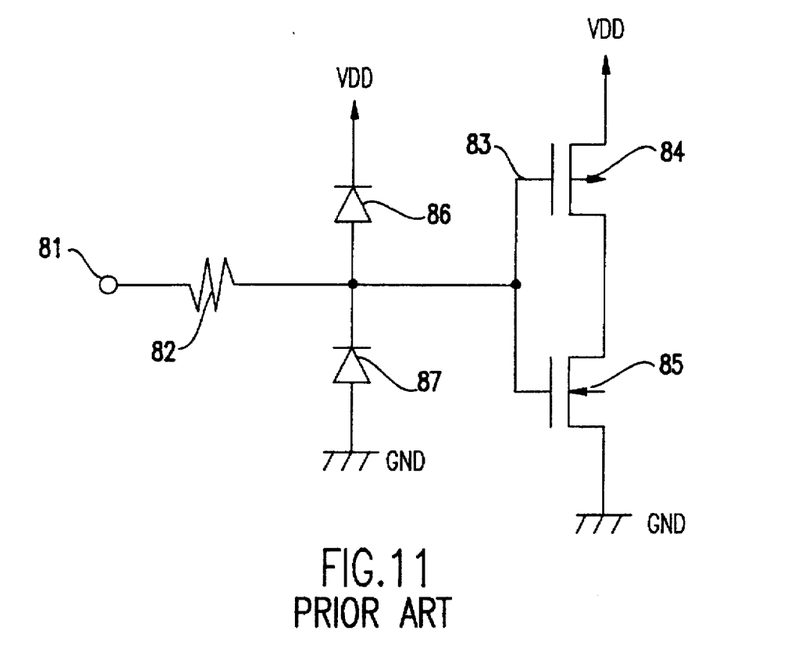
FIG. 11 is a circuit diagram of a prior art.

In the input protective circuit as shown in FIG. 11 or FIG. 12, when a surge voltage such as that in the electric static discharging test (ESD test) (charge capacity 100 pF and charge resistance 1500 Ω) is applied to the input terminal 81 or 91, a current due to the surge voltage flows into the resistor 82 or 92. As a result, the resistors 82 and 92 made of poly-silicon on a field oxide film are easily broken down.

Moreover, these input protective circuits have the respective input impedance that is substantially equal to the gate impedance of the MOSFET. For this reason, these circuits are not applicable to such a circuit that requires a certain input impedance. For example, an RS-232C interface circuit requires the predetermined impedance of 3 kΩ to 7 kΩ.

Figure 13:
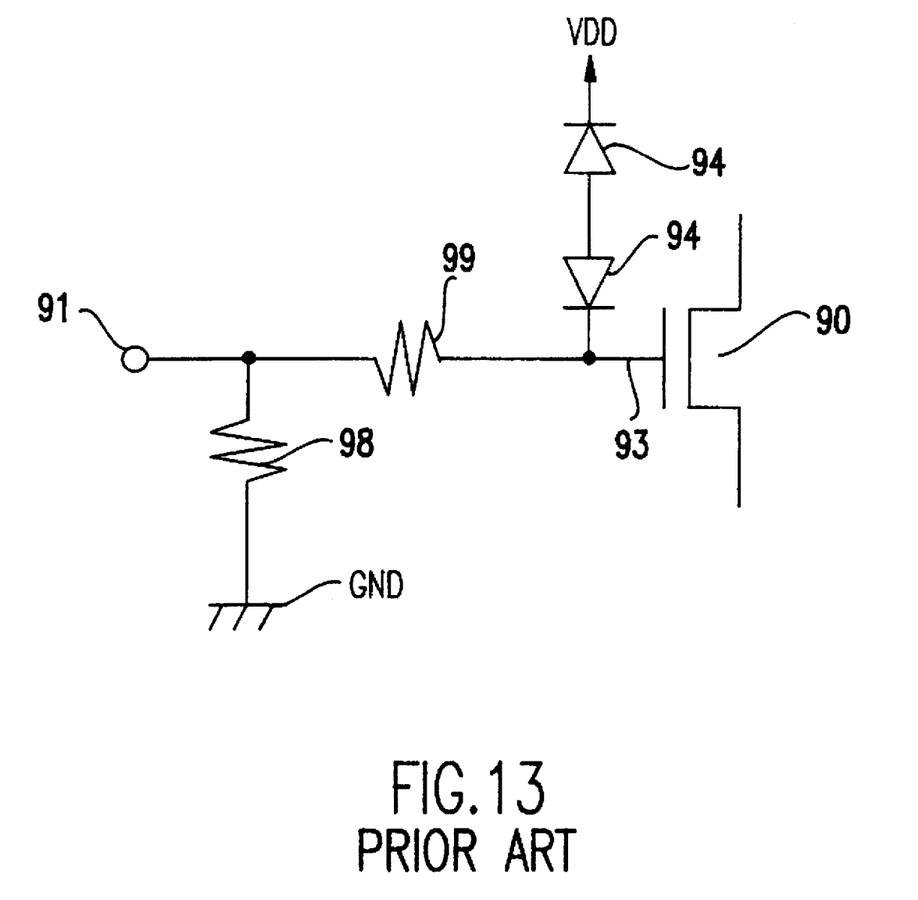
FIG. 13 is a circuit diagram of still another prior art.

For this purpose, such an input protective circuit as shown in FIG. 13 has been proposed. In this input protective circuit, the gate 93 and the input terminal 91 are connected by a resistor 99, and the input terminal 91 and the ground GND are connected by a resistor 98. Further, the gate 93 is connected to the power supply VDD by a pair of diodes 94 and 95 that are connected in series in opposite directions. Accordingly, the input impedance is substantially determined by the resistor 98.

However even in the input protective circuit of FIG. 13, when a surge voltage such as that in the ESD test is applied Go the input terminal 91, there is a problem that the resistors 98 and 99 may be broken down because a large current due to the surge voltage flows through the resistors 98 and 99.

SUMMARY OF THE INVENTION

It is an object of this invention to provide an input protective circuit in which a protective resistor is free from being broken down during the protecting operation against a surge voltage.

It is another object of the present invention to provide an input protective circuit which presents a required input impedance without causing input resistors to be destroyed.

A semiconductor device according to the present invention includes an input protective circuit which has a first node, a second node, a power supply line, a internal circuit connected to said second node, an input terminal connected to directly said first node, a first register connected between said first node and second node for decreasing surge voltage to said internal circuit from said input terminal, a first discharge circuit connected between said second node and said power supply line, and a second discharge circuit connected between said first node and said power supply line, for protecting said internal circuit and first register from surge voltage.

With the above construction, this invention has an effect of protecting a semiconductor circuit and a series input resistor from an excessive voltage applied to the input terminal by connecting a first diode pair on the input terminal connection side of the series input resistor, and connecting a second diode pair on the semiconductor circuit connection side of the series input resistor. Moreover, when a parallel resistor is provided at the input terminal, this invention also has an effect of holding the input impedance of the semiconductor circuit to a certain range until the first diode pair is energized even when an excessive voltage is applied to the input terminal.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE DRAWINGS

Figure 1:
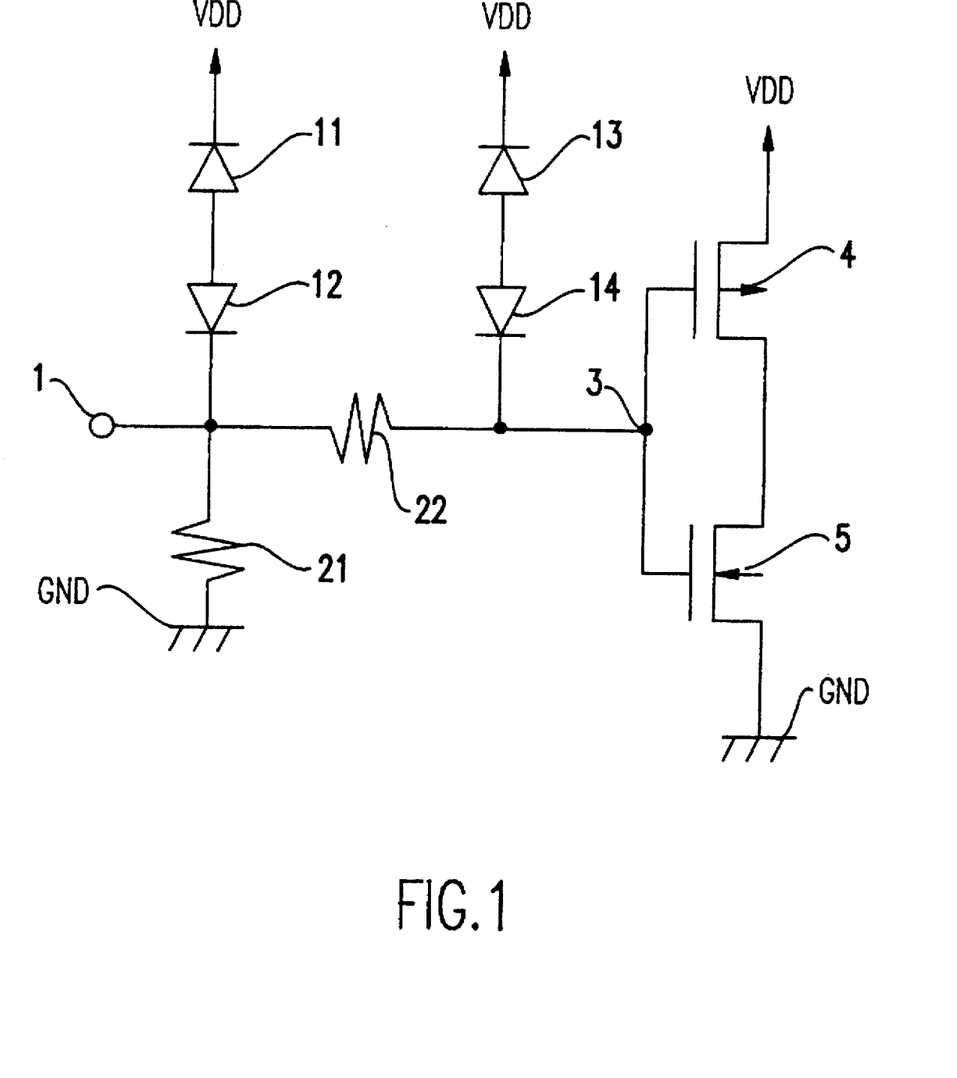
FIG. 1 is a circuit diagram showing of the input protective circuit according to a first embodiment of the present invention.

Referring now to FIG. 1, an input protective circuit according to a first embodiment of the present invention is formed on a semiconductor substrate (not shown) and provided between the common gate 3 of a P-type MOSFET 4 and an N-type MOSFET 5 and an input terminal or pad 1. This circuit includes a protective resistor 22 and four diodes 11 to 14. The anodes of the diodes 13 and 14 are mutually connected, and the cathode of the diode 13 is connected to a power supply VDD (high potential power supply) and the cathode of the diode 14 is connected to the gate 3. Anodes of the diodes 11 and 12 are mutually connected, and the cathode of the diode 11 is connected to VDD and the cathode of the diode 12 is connected to the input terminal 1. In addition, a resistor 21 for determining an input impedance is connected between the input terminal 1 and the ground GND.

Next, the method of forming various parts of the embodiment on the semiconductor substrate will be described. Each of the resistors 21 and 22 is formed of polycrystalline silicon and formed on a field oxide film with thickness of 8000 Å (not shown) covering the substrate.

Figure 2:
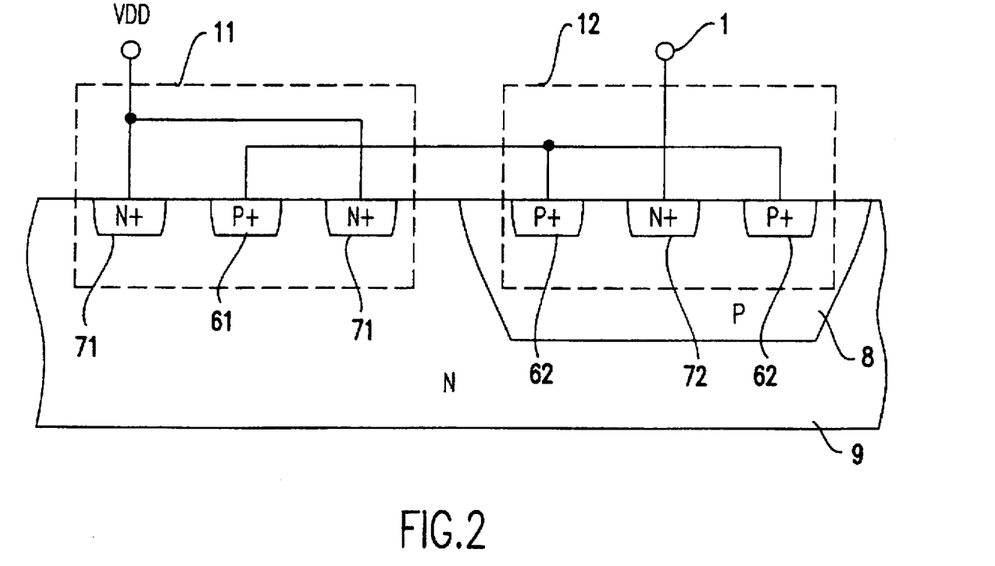
FIG. 2 is a sectional view indicative of diodes 11 and 12 shown in FIG. 1.

As shown in FIG. 2, the diodes 11 and 12 are formed, first, by implanting a P-type impurity at the dose of $8 \times 10^{12}$ atoms/cm$^2$ into a prescribed region on an N-type semiconductor substrate 9 of 4 Ω.cm resistivity, and forming a P-type well layer 8 by thermal diffusion at 1200° C. for 9 hours. Then, the diode 12 is formed in the P-type well layer 8, and the diode 11 is formed on the N-type semiconductor substrate 9. Namely, N$^+$ layers 71 and 72, and P$^+$ layers 61 and 62 are formed in prescribed regions on the N-type semiconductor substrate 9 and the P-type well layer 8 in the N-type semiconductor substrate 9 by implanting a high concentration N-type impurity at a dose of $1 \times 10^{16}$ atoms/cm$^2$ and a high concentration P-type impurity at a dose of $5 \times 10^{16}$ atoms/cm$^2$, respectively.

The P$^+$ layer 61 in the N-type semiconductor substrate 9 serves as an anode region, the N$^+$ layers 71 in its surroundings serve as a cathode region, constituting the diode 11. Similarly, the N$^+$ layer 72 of the P-type layer 8 serves as a cathode region and the P$^+$ layers 62 in its surroundings serve as an anode region, constituting the diode 12.

Figure 3:
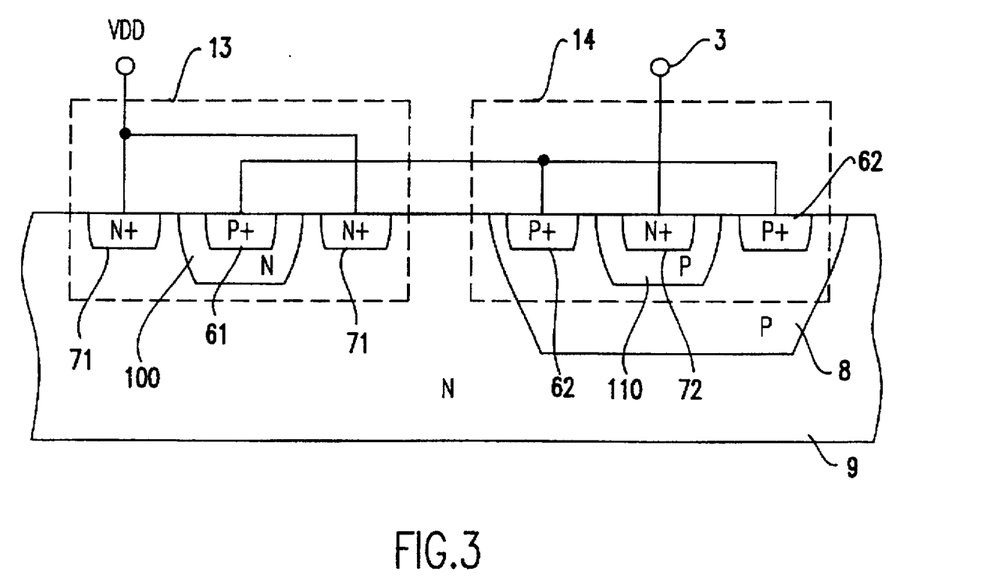
FIG. 3 is a sectional view indicative of diodes 13 and 14 shown in FIG. 1.

As shown in FIG. 3, the diodes 13 and 14 are formed in the same manner as the diodes 11 and 12 except for minor changes. After the formation of the well layer 8, an N layer 100 and a P layer 110 are formed by implanting an N-type impurity to the region for the anode of the diode 13 at the dose of $2 \times 10^{13}$ atoms/cm$^2$, and a P-type impurity to the region for a cathode of the diode 14 at the dose of $6 \times 10^{12}$ atoms/cm$^2$, and subjecting the sample to heat treatment at temperature 1140° C. for 30 minutes. The layer 100 is thus higher in impurity concentration than the substrate 9, and the layer 110 is higher in impurity concentration than the well region 8. Then, N$^+$ layers 71 and 72, and P$^+$ layers 61 and 62 are formed analogous to the case of formation of the diodes 11 and 12. Due to the difference in the formation process in the above, the breakdown voltage of the diodes 13 and 14 is 35 V in contrast to the breakdown voltage of the diodes 11 and 12 of 45 V.

Figure 4:
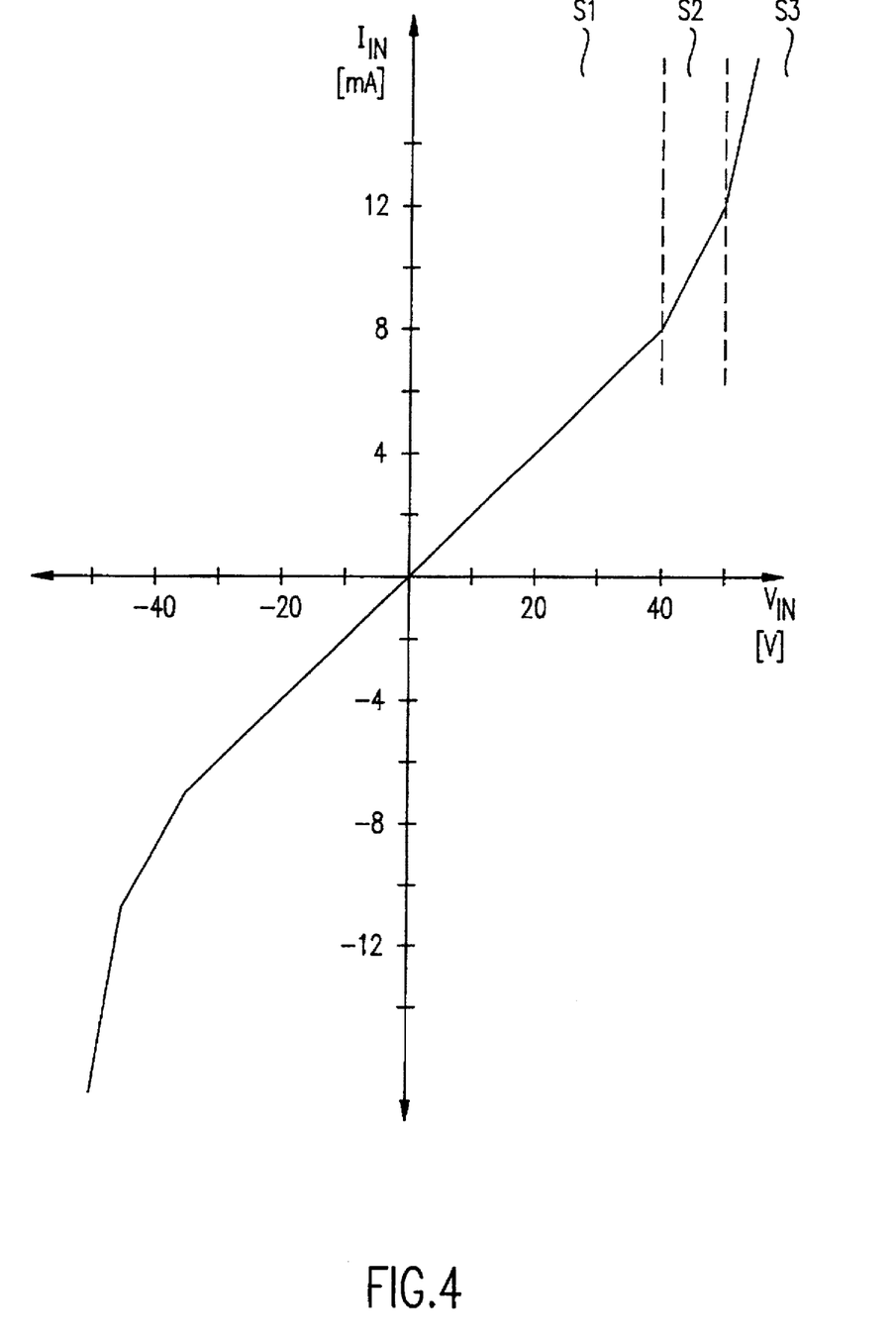
FIG. 4 is a characteristic diagram for explaining the operation of the input protective circuit shown in FIG. 1.
Figure 5:
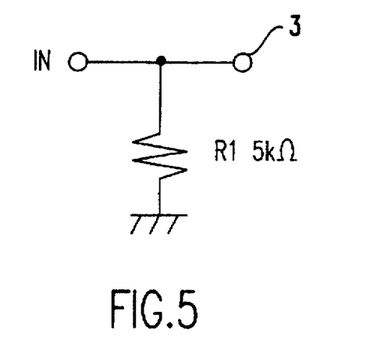
FIG. 5 is an equivalent circuit diagram of the input protective circuit of FIG. 1 in a state S1 in FIG. 4.
Figure 6:
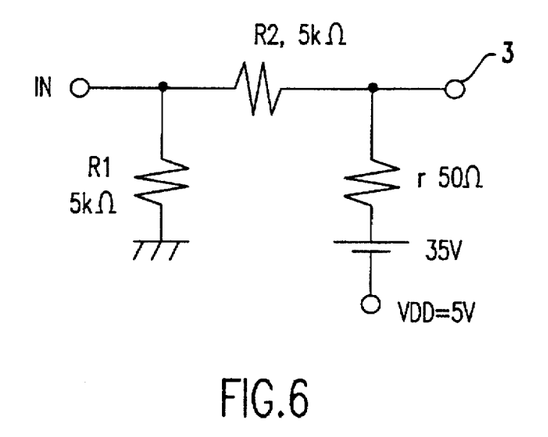
FIG. 6 is an equivalent circuit diagram of the input protective circuit of FIG. 1 in a state S2 in FIG. 4.
Figure 7:
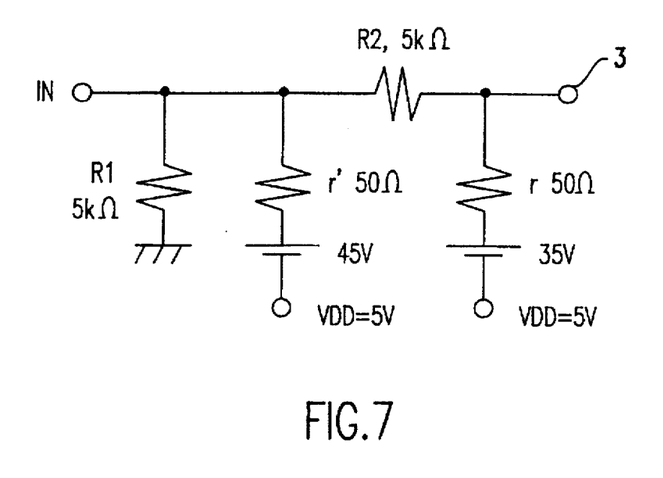
FIG. 7 is an equivalent circuit diagram of the input protective circuit of FIG. 1 in a state S3 in FIG. 4.

Referring to FIG. 4, there is shown the relation between the input voltage ($V_{IN}$) and the input current ($I_{IN}$) for the case when the resistance values R1 and R2 of the resistors 21 and 22 are set 5 kΩ. The equivalent circuits of the input protective circuit for the states or regions S1, S2 and S3 of the positive polarity input are as shown in FIG. 5, FIG. 6 and FIG. 7. Note that the region S1 indicates a steady operation. Accordingly, none of the diodes are not turned ON, so that the input impedance of this circuit is determined by the resistor R1 (5 kΩ).

In the region S2 in which the input pad 1 is raised to a voltage range between 40 and 50 V due to a surge voltage, the diodes 13 and 14 are broken down and the equivalent circuit for the diodes 13 and 14 can be represented by a voltage source of 35 V and a resistor with resistance value of r. The resistance value r is the sum of the forward resistance value of the diode 13 and the backward resistance value of the diode 14, which is about 50 Ω. Accordingly, the input impedance in the region S2 is about 2.5 kΩ.

In the region S3 in which the voltage at the input terminal 1 is further raised due to the increase of the surge voltage, the diode 12 is also in the breakdown condition, and the diodes 11 and 12 can be represented by a voltage source of 45 V and a resistor with resistance value of r'. The resistance value r' is the sum of the forward resistance value of the diode 11 and the backward resistance value of the diode 12, which is about 50 Ω. Accordingly, the input impedance in the regions S3 is about 50 Ω.

Although an input of positive polarity was assumed in the above description, it can easily be seen that the circuit operates in a similar manner for the case of negative polarity. It is because even if the voltage is of equal absolute value, the potential difference between the input and the power supply becomes larger because of the opposite polarities of the input and the power supply, which brings about sooner energization of the diodes. When an surge voltage (for example, 60 V) is applied to the input terminal 1, the voltage of the gate 3 is limited to about 40 V by the diodes 13 and 14 and the gate is protected.

Further, when an surge voltage such as that of the ESD test is applied to the input terminal 1, the resistor 21 is protected because the voltage of the input terminal 1 is limited to about 50 V by the action of the diodes 11 and 12. In addition, since the voltage applied to the resistor 22 is limited to about 10 V as a result of cooperation of the diodes 11 and 12, and the diodes 13 and 14, the resistor 22, too, is protected against breakdown (in an actual ESD test, this circuit did not suffer from breakdown even when the voltage applied to the input terminal 1 was 2 kV). In the embodiment in the above, the anodes of the diodes 11 and 12, and of the diodes 13 and 14 are mutually connected, but it is obvious that the cathodes may be connected instead for both sets.

Figure 8:
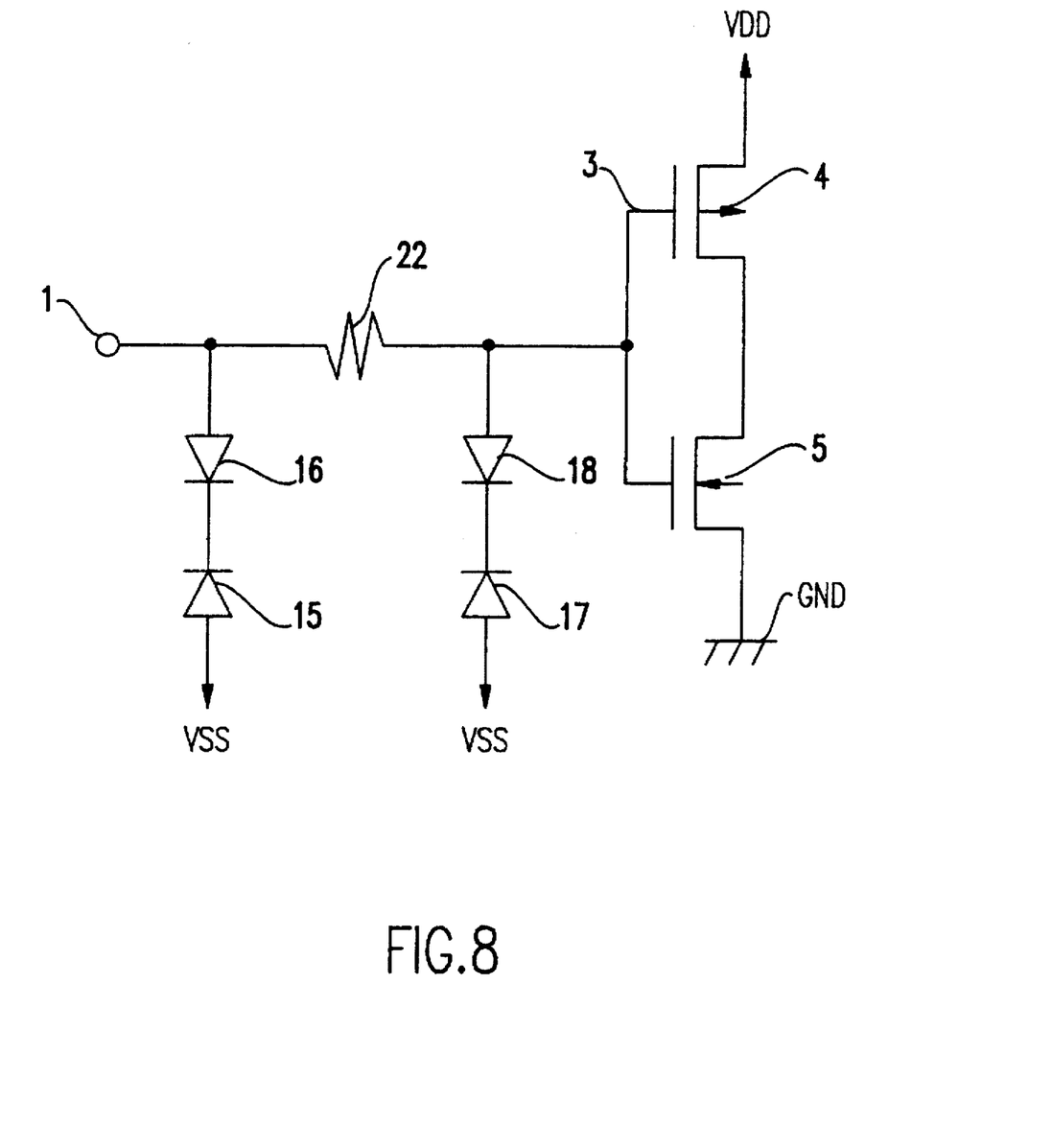
FIG. 8 is a circuit diagram showing an input protective circuit according to a second embodiment of the present invention.

Next, referring to FIG. 8, FIG. 9 and FIG. 10, a second embodiment of this invention will be described. Differing from the embodiment in FIG. 1, this embodiment is a circuit for the case where it is not necessary to hold the input impedance within specified values.

The gate 3 and the input terminal 1 are connected by the resistor 22. A diode pair consisting of diodes 15 and 16 is connected between the input terminal 1 and a low potential power supply VSS. A diode pair consisting of diodes 17 and 18 is connected between the gate 3 and the low potential power supply VSS. Even if an surge voltage is applied to the input terminal, the input voltage is limited by the diodes 15 and 16, and the diodes 17 and 18, so that the gate 3 and the resistor 22 are protected.

Figure 9:
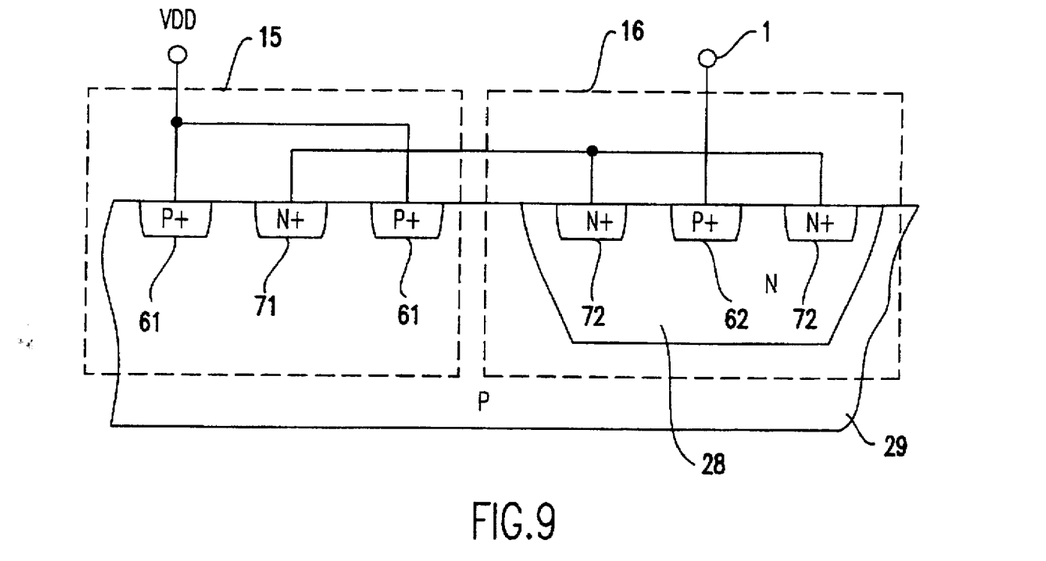
FIG. 9 is a sectional view indicative of diodes 15 and 16 according to FIG. 8.
Figure 10:
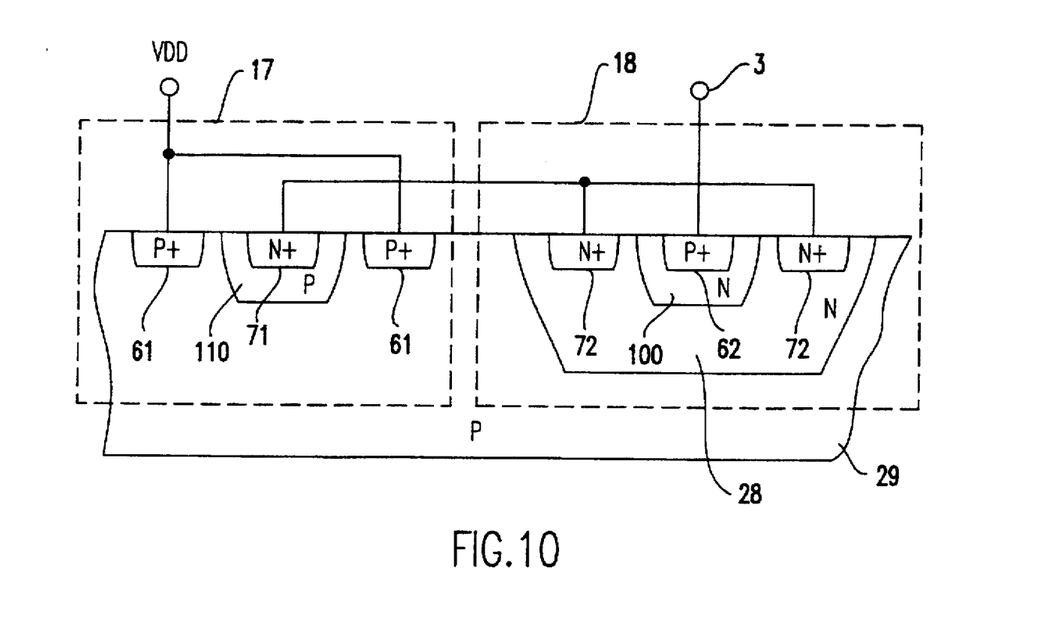
FIG. 10 is a sectional view indicative of diodes 17 and 18 according to FIG. 8.

The diodes 15 and 16 are formed, as shown in FIG. 9, by forming an N-type well layer 28 in a P-type semiconductor substrate 29, and then forming P$^+$ layers 61 and 62 and N$^+$ layers 71 and 72. Further, the diodes 17 and 18 are formed, as shown in FIG. 10, by forming the N-type well layer 28 in the P-type semiconductor substrate 29, forming an N$^-$ layer 100 and a P$^-$ layer 110, and further forming P$^+$ layers 61 and 62 and N$^+$ layers 71 and 72.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention. For example, in FIG. 1 and FIG. 8, each cathode of diode 11 and diode 15 may be connected between the input terminal 1 and VDD, each anode of diode 12 and diode 16 may be connected between the input terminal 1 and GND, each cathode of diode 13 and diode 17 may be connected between the gate 3 and VDD, and each anode of diode 14 and diode 18 may be connected between the gate 3 and GND.

What is claimed is:

1. A semiconductor device having an input protective circuit for an internal circuit, said input protective circuit comprising:
   a first node;
   a second node connected to said internal circuit;
   a power supply line;
   an input terminal connected to said first node without an intervention of a substantial impedance;
   a first resistor connected between said first node and second node;
   a first discharge circuit connected between said second node and said power supply line; and
   a second discharge circuit connected between said first node and said power supply line.

2. The device according to claim 1, wherein each of said first and second discharge circuits comprises two diodes connected in series between an associated one of said first and second nodes and said power supply line.

3. The device according to claim 1, wherein said first discharge circuit has a first threshold level and said second discharge circuit has a second threshold level larger than said first threshold level.

4. The device according to claim 1, further comprising a second resistor and an additional power line, said second resistor being connected between said first node and said additional power supply line.

5. The device according to claim 4, wherein said first discharge circuit has a first threshold level and said second discharge circuit has a second threshold level larger than said first threshold level.

6. A semiconductor device having an input protective circuit for a MOS transistor, said circuit comprising:
   a first node;
   a second node connected to said MOS transistor; a first power supply line;
   an input terminal connected directly to said first node;
   a first resistor connected between said first node and second node;
   a first discharge circuit connected between said second node and said first power supply line and having a first threshold level, said first discharge circuit comprising at least one diode connected between said second node and said first power supply line; and
   a second discharge circuit connected between said first node and said first power supply line and having a second threshold level larger than said first threshold level, said second discharge circuit having at least one diode connected between said second node and said first power supply line.

7. The device as claimed in claim 6, further comprising a second resistor connected between said first node and a second power supply line.

8. The device according to claim 1, wherein said first discharge circuit and said second discharge circuit each comprise a pair of diodes, each of said diodes including an anode and a cathode,
   wherein an anode of a first diode of each pair of diodes is connected to an anode of a second diode of each of said pair of diodes, a cathode of said first diode being connected to said power supply line and a cathode of said second diode being connected to one of said first node and said second node.

9. The device according to claim 6, wherein said first discharge circuit and said second discharge circuit each comprise a pair of diodes, each of said diodes including an anode and a cathode,
   wherein an anode of a first diode of each pair of diodes is connected to an anode of a second diode of each of said pair of diodes, a cathode of said first diode being connected to said power supply line and a cathode of said second diode being connected to one of said first node and said second node.

10. The device according to claim 3, wherein a first voltage is less than a breakdown voltage for damaging said first resistor,
    said second threshold being larger than said first threshold level by an amount less than said first voltage, such that a voltage between said first node and said second node does not exceed said first voltage.

11. The device according to claim 6, wherein a first voltage is less than a breakdown voltage for damaging said first resistor,
    said second threshold being larger than said first threshold level by an amount less than said first voltage, such that a voltage between said first node and said second node does not exceed said first voltage.

12. The device according to claim 1, wherein said input terminal is directly connected to said first node.

13. The device as in claim 1, wherein said first discharge circuit diverts a voltage surge such that said voltage surge does not damage said resistor.

14. A surge protection circuit, comprising:
    an input terminal;
    a line having a first end connected to said input terminal, a first node directly connected to said first end, a second end opposite said first end and a second node directly connected to said second end;
    a first surge protector connected to said first node and to a voltage source; and
    a second surge protector connected to said second node and said voltage source,
    wherein said line includes a resistor between said first node and said second node.

15. A circuit as in claim 14, wherein said first surge protector diverts a voltage surge from said line such that said voltage surge does not damage said resistor.

16. A circuit as in claim 14, wherein said first surge protector and said second surge protector each comprise a pair of diodes, each of said diodes including an anode and a cathode,
    wherein an anode of a first diode of each pair of diodes is connected to an anode of a second diode of each of said pair of diodes, a cathode of said first diode being connected to said voltage source and a cathode of said second diode being connected to one of said first node and said second node.

17. A circuit as in claim 16, wherein said first diode and said second diode are connected in series.

18. A circuit as in claim 14, wherein said first surge protector has a first threshold level and said second surge protector has a second threshold level larger than said first threshold level.

19. The circuit as in claim 18, wherein a first voltage is less than a breakdown voltage for damaging said resistor,
   said second threshold being larger than said first threshold level by an amount less than said first voltage, such that a voltage between said first node and said second node does not exceed said first voltage.

20. The circuit as in claim 14, further comprising a second resistor having a first end connected to said first node and a second end connected to a ground voltage.

21. A semiconductor device having an input protective circuit for an internal circuit, said input protective circuit comprising:
   a first node;
   a second node connected to said internal circuit;
   a first power supply line;
   a second power supply line;
   an input terminal directly connected to said first node;
   a first resistor connected between said first node and said second node;
   a second resistor connected between said first node and said second power supply line;
   a first discharge circuit, connected between said second node and said first power supply line, having a first positive breakdown voltage and a first negative breakdown voltage, said first discharge circuit disconnecting a current path between said second node and said first power supply line when said second node has a voltage between said first positive breakdown voltage and said first negative breakdown voltage; and
   a second discharge circuit, connected between said first node and said first power supply line, having a second positive breakdown voltage and a second negative breakdown voltage, said second discharge circuit disconnecting a current path between said first node and first power supply line when said first node has a voltage between said second positive breakdown voltage and said second negative breakdown voltage.

22. A semiconductor device having an input protective circuit for a MOS transistor, said circuit comprising:
   a first node;
   a second node connected to said MOS transistor;
   a first power supply line;
   a second power supply line;
   an input terminal directly connected to said first node;
   a first resistor connected between said first node and said second node;
   a second resistor connected between said first node and said second power supply line; and
   a first discharge circuit connected between said second node and said first power supply line and having a first positive breakdown voltage, said first discharge circuit disconnecting a current path between said second node and said first power supply line when said second node has a voltage between said first positive breakdown voltage and a first negative breakdown voltage.

23. A semiconductor device as in claim 22, wherein said first discharge circuit includes at least one diode connected between said second node and said first power supply line.

* * * * *